US007169649B2

(12) United States Patent
Rosa et al.

(10) Patent No.: US 7,169,649 B2
(45) Date of Patent: Jan. 30, 2007

(54) WAFER SCALE INTEGRATION OF ELECTROPLATED 3D STRUCTURES USING SUCCESSIVE LITHOGRAPHY, ELECTROPLATED SACRIFICIAL LAYERS, AND FLIP-CHIP BONDING

(75) Inventors: Michel A. Rosa, Queensland (AU); Eric Peeters, Freemont, CA (US)

(73) Assignee: Palo Alto Research Center, Inc., Palo Alto, CA (US)

( * ) Notice: Subject to any disclaimer, the term of this patent is extended or adjusted under 35 U.S.C. 154(b) by 285 days.

(21) Appl. No.: 11/012,597

(22) Filed: Dec. 16, 2004

(65) Prior Publication Data

US 2006/0134829 A1 Jun. 22, 2006

(51) Int. Cl.
*H01L 21/56* (2006.01)

(52) U.S. Cl. ........................ 438/118; 438/106; 438/124

(58) Field of Classification Search .................. 438/29, 438/106, 112, 118, 124, 127
See application file for complete search history.

(56) References Cited

U.S. PATENT DOCUMENTS 6,475,369 B1 11/2002 Cohen
6,872,319 B2 * 3/2005 Tsai .............................. 216/2
2003/0127336 A1 7/2003 Cohen et al.
2003/0183008 A1 10/2003 Bang et al.
2003/0221968 A1 12/2003 Cohen et al.
2003/0222738 A1 12/2003 Brown et al.
2003/0234179 A1 12/2003 Bang
2004/0004001 A1 1/2004 Cohen et al.
2004/0004002 A1 1/2004 Thompson et al.
2004/0007468 A1 1/2004 Cohen et al.
2004/0007469 A1 1/2004 Cohen et al.
2004/0007470 A1 1/2004 Smalley
2004/0020782 A1 2/2004 Cohen et al.
2004/0140862 A1 7/2004 Brown et al.

* cited by examiner

*Primary Examiner*—Zandra V. Smith
*Assistant Examiner*—Pamela E Perkins
(74) *Attorney, Agent, or Firm*—Oliff & Berridge, PLC

(57) ABSTRACT

Wafer scale fabrication of three dimentional substantially enclosed structures on a MEMS/IC die use a combination of electrodeposition of structural and sacrificial layers and flip-chip alignment and bonding technology. A first wafer contains a die with MEMS and/or IC structures. On this MEMS/IC processed die, a first three dimensional structural component is formed using standard lithographic processes and electrodeposition of a structural layer. A second sacrificial wafer is separately processed using similar lithographic and electrodeposition processes to form a corresponding second three dimensional structural component. The wafers are placed in a flip-chip bonder and aligned. Once aligned, the structural components are bonded together. The bonded wafers are then removed from the bonder and the second sacrificial wafer substrate removed. The resultant die includes a three dimensional structural component with a substantially enclosed cavity as well as MEMS and IC elements.

20 Claims, 19 Drawing Sheets

WAFER SCALE INTEGRATION OF ELECTROPLATED 3D STRUCTURES USING SUCCESSIVE LITHOGRAPHY, ELECTROPLATED SACRIFICIAL LAYERS, AND FLIP-CHIP BONDING

BACKGROUND

Low-cost, low temperature, wafer scale solutions to fabrication of three dimensional structures defining one or more cavities are provided. The use of two wafers, each having a single electroplated layer, can achieve 3D electroplated structures with less complicated or costly manufacturing processes. The fabrication processes are particularly suited for the manufacture of integrated ink jet manifold and nozzle structures on a printhead die.

Currently, electroplated structures fabricated for MEMS/IC-type applications are made using a single layer of structural material that is micro machined. However, formulation of a 3D structure through micromachining is difficult. A few multiple layered structures have been fabricated using alternate deposition of structural and sacrificial layers. Examples of these include: U.S. Pat. No. 6,475,369 to Cohen, U.S. Patent Application Publication No. US2004/0004001A1 to Cohen et al., U.S. Patent Application Publication No. US2003/0234179A1 to Bang, U.S. Patent Application Publication No. US2003/0221968A1 to Cohen et al., U.S. Patent Application Publication No. US2004/004002A1 to Thompson et al., U.S. Patent Application Publication No. US2004/007468A1 to Cohen et al., U.S. Patent Application Publication No. US2004/0007469A1 to Zhang et al., U.S. Patent Application Publication No. US2004/0007470A1 to Smalley, U.S. Patent Application Publication No. US2004/0020782A1 to Cohen et al., U.S. Patent Application Publication No. US2004/0140862A1 to Brown et al., U.S. Patent Application Publication No. US2003/0127336A1 to Cohen et al., U.S. Patent Application Publication No. US2003/0183008A1 to Bang et al., and U.S. Patent Application Publication No. US2003/0222738A1 to Brown et al.

It is often necessary in many manufacturing processes to provide a sealed or otherwise enclosed structure of substantial thickness to enclose a device with a hollow interior or cavity. For example, in typical ink jet printheads, there is a need for a manifold structure and nozzle plate structure that defines ink cavities, channels, and nozzles. Such three dimensional structures are difficult to manufacture using micromachining techniques. Moreover, many high temperature solutions may adversely effect existing MEMS and IC components.

There is a need for improved fabrication techniques that can more readily produce hollow cavities or sealed enclosure in semiconductor devices.

SUMMARY

In accordance with certain aspects, a fabrication process is provided that allows surface micromachined structures, either freely moving or cavity based, to be produced based on electroplated methods and materials. Mechanical and/or structural devices can be formed using electroplating techniques in conjunction with sacrificial materials that can also be formed using electroplated techniques. This can produce devices that are attached at only selected points to a substrate and/or structures having enclosed cavities on or above a working substrate. A particularly relevant use of such structure forming techniques is in the fabrication of an ink jet manifold and nozzle structure for use in an ink jet print head, particularly a MEMS-based ink jet print head.

In exemplary embodiments, wafer scale fabrication techniques are provided in which three dimensional electrodeposited nozzle and manifold structures are separately formed on two different wafer substrates by lithography and electrodeposition processes and subsequently assembled together. In preferred embodiments, only a single electroplating step is needed on each wafer.

In various exemplary embodiments, manifold structures are formed on a wafer substrate that has previously been processed to contain MEMS and/or IC structures on the wafer.

In various exemplary embodiments, at least one of the nozzle and manifold structures is deposited with a bonding layer, such as a reflowable solder that allows bonding of the nozzle and manifold structures together to form integrated structures having a three dimensional cavity or enclosure.

In preferred exemplary embodiments, the two wafer substrates are mounted in a flip-chip bonding device for alignment and bonding of the nozzle and manifold structures.

In exemplary embodiments, one of the wafers is a sacrificial wafer and a release layer is formed between the sacrificial wafer and the electrodeposited structure to enable release and removal of the second wafer after flip-chip bonding of the nozzle and manifold structures.

In preferred embodiments, the fabrication process is performed at the wafer scale level and integrated with a Micro-Electro-Mechanical-System (MEMS) and/or Integrated Circuit (IC) chip assembly (MEMS/IC) fabrication process. After formation and batch processing of the MEMS and IC components, manifold structures are fabricated on top of the MEMS/IC wafer for each semiconductor device using a combination of electrodeposition and sacrificial layers. A second sacrificial wafer is separately batch processed to have nozzle structures fabricated using a combination of electrodeposition and sacrificial layers. A releasable or sacrificial layer is provided between the second wafer substrate and the nozzle structure, such as an a-Si layer that allows for subsequent release of the sacrificial wafer. At least one of the nozzle and manifold structures is provided with a bonding layer, such as a reflowable solder, for example PbSn.

In various embodiments, assembly may be achieved by placing both wafers into a flip chip bonding device. In particular, the sacrificial second wafer is inverted so that the nozzle structure is opposed to the manifold structure on the first wafer. After alignment of the nozzle structures with corresponding manifold structures, the first and second wafers are moved into contact. At this time, the bonding layer is heated to cause the bonding layer to reflow. After sufficient cooling, this results in bonding of the nozzle structures and the manifold structures together. The second sacrificial wafer base substrate can then be removed to form a resultant ink jet printhead chip containing one or more three dimensional sealed or hollow cavities therein.

In an exemplary embodiment, a wafer scale fabrication process for fabricating three dimensional structures having at least one substantially enclosed cavity on a processed wafer including die elements containing pre-existing MEMS and IC structures thereon includes: applying and patterning a first photoresist mask on a first wafer containing at least one die having pre-existing MEMS and IC structures thereon to define boundaries of a first three dimensional structural element component; electrodepositing a structural layer of material into the patterned photoresist mask to define walls of the first three dimensional structural element component; electrodepositing a reflowable bonding layer on top of the structural layer; removing the first photoresist mask; applying and patterning a second photoresist mask on a second sacrificial wafer to define boundaries of a second three dimensional structural element component; electrodepositing a structural layer of material into the patterned second photoresist mask to define a second three dimensional structural element component; removing the second photoresist mask; mounting the first and second wafers on stages of a flip-chip alignment and bonding machine; rotating one of the stages to provide the first and second three dimensional structural element components in a spaced opposed orientation; precisely aligning the first and second three dimensional structural element components relative to each other; relatively moving the first and second wafers towards each other until the first and second three dimensional structural element components are substantially abutted; applying heat to reflow the bonding layer and bond the first three dimensional structural element component to the second three dimensional structural element component; and removing the second sacrificial wafer from the second three dimensional structural element component to form an integrated three dimensional structural element on a MEMS/IC containing die.

In another embodiment, a wafer scale fabrication process for fabricating three dimensional structures having at least one substantially enclosed cavity on a processed wafer including die elements containing pre-existing MEMS and IC structures thereon, includes: providing a first wafer containing at least one die having pre-existing MEMS and IC structures thereon; applying a patterned seed material on the die on the first wafer; applying and patterning a first photoresist mask on a second wafer to define boundaries of a first three dimensional structural element component; electrodepositing a structural layer of material into the patterned photoresist mask to define walls of the first three dimensional structural element component; applying and patterning a second photoresist mask on a second sacrificial wafer to define boundaries of a second three dimensional structural element component; electrodepositing a second structural layer of material into the patterned second photoresist mask to define a second three dimensional structural element component; removing the second photoresist mask; electrodepositing a reflowable bonding layer on top of the second structural layer; mounting the first and second wafers on stages of a flip-chip alignment and bonding machine; rotating one of the stages to provide the first and second wafers in a spaced opposed orientation; precisely aligning the first and second three dimensional structural element components to the first wafer; relatively moving the first and second wafers towards each other until the first and second three dimensional structural element components are substantially abutted to the first wafer; applying heat to reflow the bonding layer and bond the second three dimensional structural element component to the seed material of the first wafer; and removing the second sacrificial wafer from the second three dimensional structural element component to form an integrated three dimensional structural element on a MEMS/IC containing die.

BRIEF DESCRIPTION OF THE DRAWINGS

Various exemplary embodiments of three dimensional structural fabrication will be described in detail, with reference to the following figures, wherein.

DETAILED DESCRIPTION OF EMBODIMENTS

Figure 1:
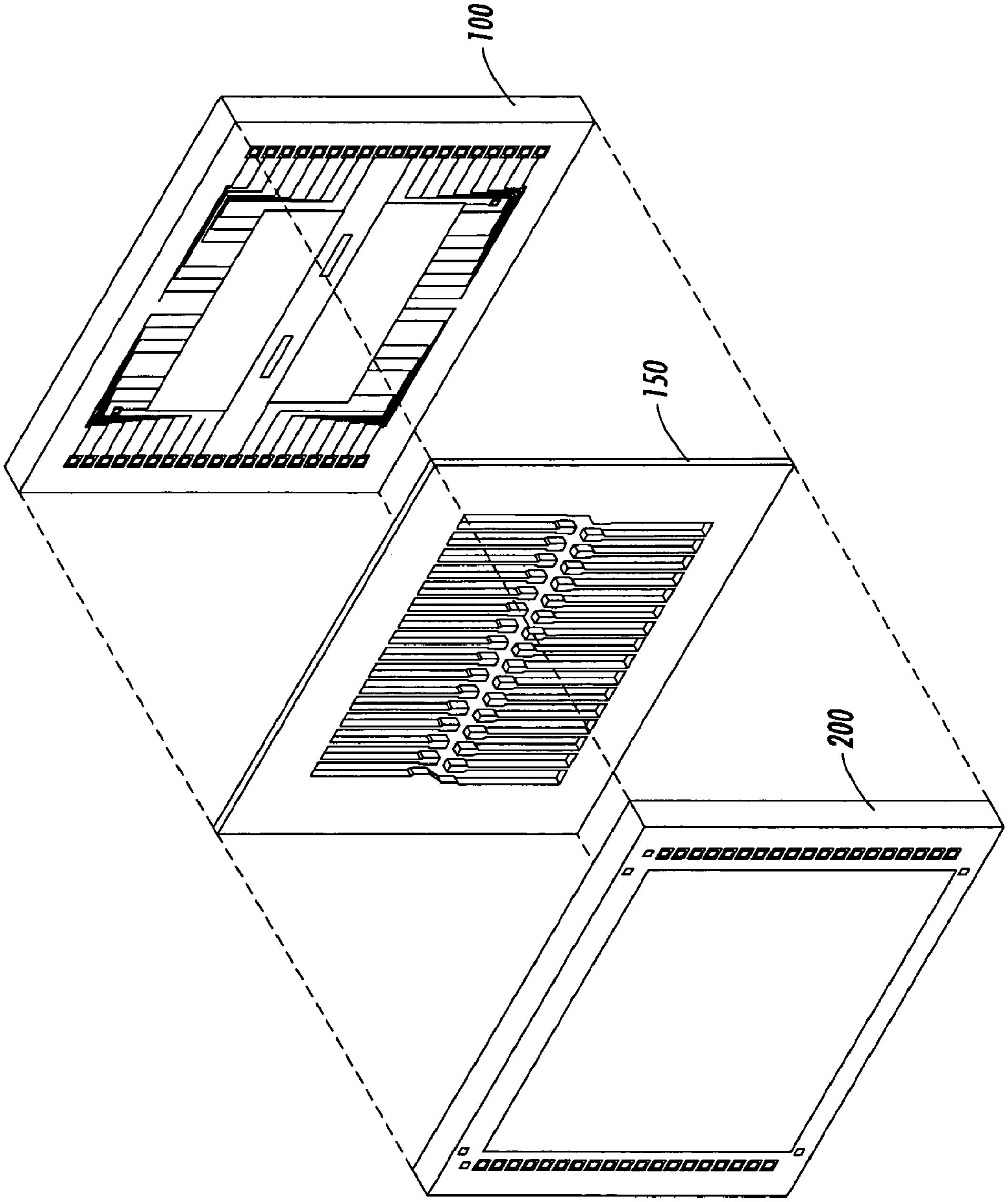
FIG. 1 shows an exploded view of an exemplary ink manifold integrated with an IC/MEMS fabrication process to form a processed ink jet chip on a wafer that is ready for dicing and subsequent processing.

Exemplary embodiments provide various processes in which electroplated three-dimensional structures are formed on a wafer scale using flip-chip alignment and bonding technology. As shown in FIG. 1, the process uses a first semiconductor wafer 100, on which has already been processed microelectromechanical systems (MEMS) and/or Integrated Circuit (IC) structures using conventional processing techniques as known in the art. On this MEMS/IC processed wafer, manifold structures 150 for each semiconductor device on the wafer are formed using standard lithographic processes and electrodeposition of three dimensional structural layers, preferably including an Ni layer.

Figure 2:
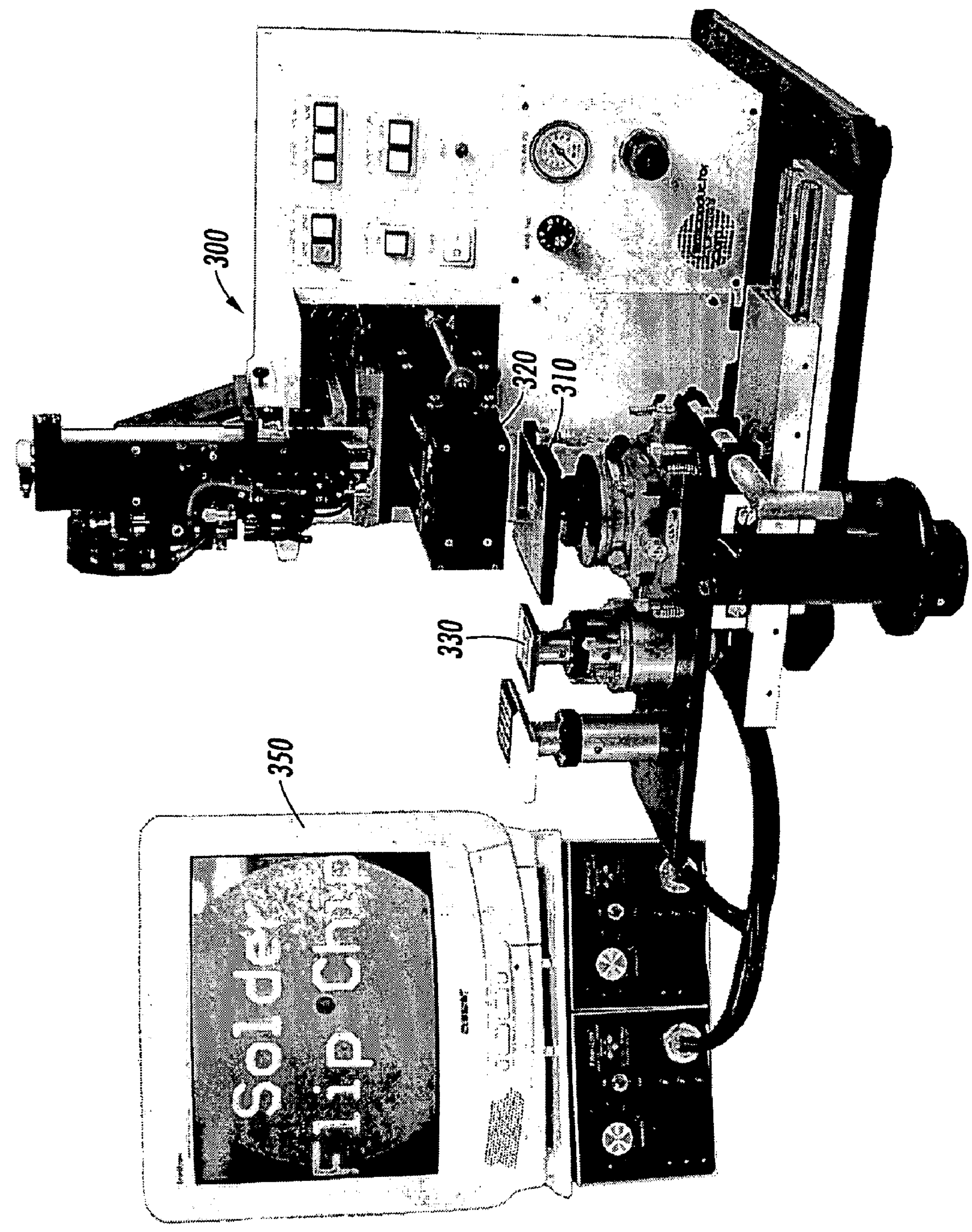
FIG. 2 shows an exemplary flip chip alignment and bonding machine.

A second sacrificial wafer 200 is separately processed using similar lithographic and electrodeposition processes to form corresponding three dimensional structural nozzles. The processed semiconductor wafers 100, 200 are then placed in a suitable flip-chip bonder (FIG. 2) and aligned. Once aligned, the nozzle structures are bonded to corresponding manifold structures 150. The bonded wafers are then removed from the bonder and the second sacrificial wafer substrate removed from the nozzles, which remain bonded to the manifold structure. This forms a complete three dimensional electrodeposited structure having enclosed or hollow cavities. The completed chips form an ink jet printhead.

There are various commercially available flip-chip alignment and bonding machines. A suitable machine 300 is the Model 850 Flip Chip Placement System available from Semiconductor Equipment Corp. of Moorpark, Calif. With this machine, device components are mounted on upper and lower vacuum stages 310, 320. The upper stage 320 is capable of being “flipped” 180 degrees, i.e., from having its upper support surface face upwards to a position where this surface faces downwards. Moreover, the upper stage is on a highly accurate micrometer stage to move individual wafers or devices on the upper and lower stages into precise alignment relative to each other. An optional fluxing station can provide fluxing of the components prior to alignment. Additionally, a heating module 330 provides heated gas to one or both wafers to achieve bonding, such as by solder reflow. Further, a video display 350 may be provided to provide close up zoom views of the aligned components.

Figure 3:
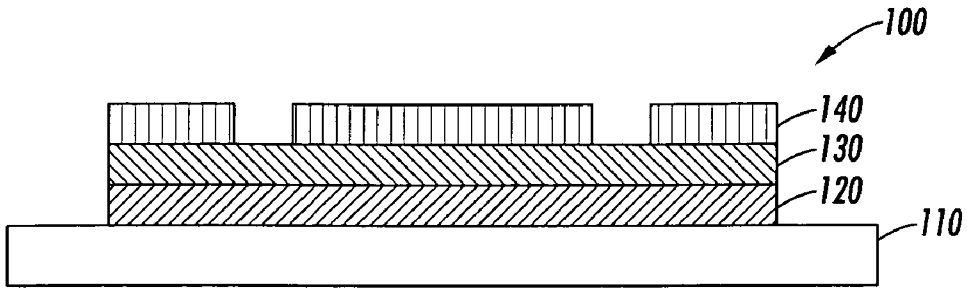
FIGS. 3–13 show an exemplary wafer scale fabrication sequence involving flip chip bonding.

A more complete explanation of the fabrication process with be provided with reference to FIGS. 3–12. As shown in FIG. 3, first semiconductor wafer 100 is formed from a base substrate 110. Based substrate 110 has been previously processed as known in the art to include microelectromechanical systems (MEMS), such as polysilicon ink actuator elements, and/or Integrated Circuit (IC) structures on the surface. Metallized seed layers 120, 130 are formed on base substrate 100 in desired locations in preparation for an electroplating step. Preferred seed layers 120 and/or 130 are formed from a suitable seed material, such as Ti and/or Au. Open areas are then patterned, using a thick photoresist 140, such as Shipley BPR-100, AZ 9620, or other known or subsequently developed resist films. A preferred photoresist has a thickness of about 40 μm.

Figure 4:
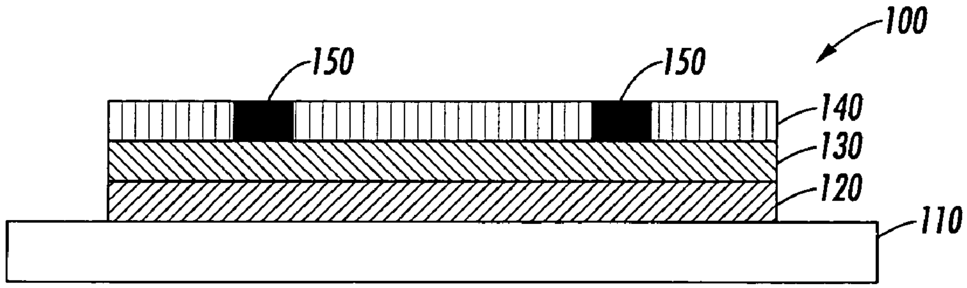

As shown in FIG. 4, a metal layer 150, such as nickel Ni, is then electrodeposited over the photoresist to form a manifold structure surrounding already present polysilicon actuator elements (unshown and formed by conventional MEMS processing) used for ejecting ink. This electroplated manifold structure 150 has a thickness on the order of 40–50 μm or possibly more and forms an ink reservoir enclosure for an ink jet print head. In particular, this electroplated structure defines outer walls of the structure as well as the inner chambers where ink is delivered before being ejected through a nozzle plate element.

Figure 5:
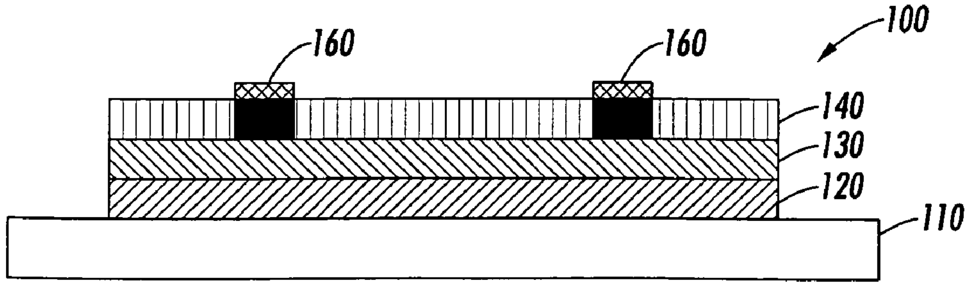
Figure 6:
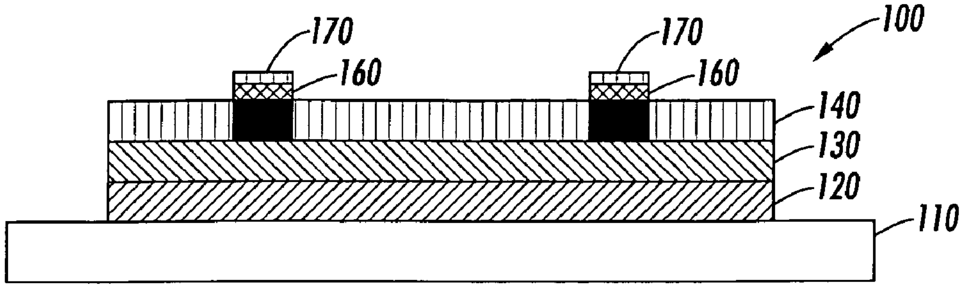

As shown in FIG. 5, a layer 160 of electrolessly deposited material, such as Au, is deposited on top of the Ni layer forming manifold structure 150. This layer prepares the surface for further electrodeposition where a bonding material layer, such as PbSn, is deposited. Although it may be possible to omit this Au layer, omission may result in poor film deposition of the PbSn in the form of overly large nodule growth across the wafer surface. Using another patterned layer of photoresist, such as Shipley BPR-100 or AZ 9620, a thin layer of a bonding material, such as a reflowable solder 170, is then deposited as shown in FIG. 6. A preferred thickness is 1–3 μm. In an exemplary embodiment, the reflowable solder is a lead-based PbSn. However, lead-free formulations may be preferable for certain applications and can be substituted. For example, a suitable non-lead formulation is Sn/Ag/Cu.

Figure 7:
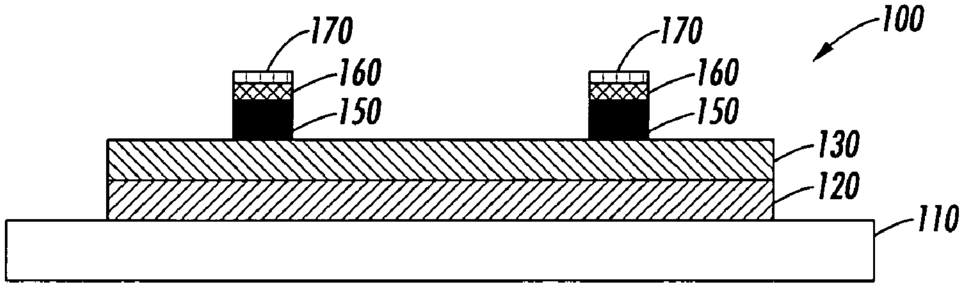
Figure 8:
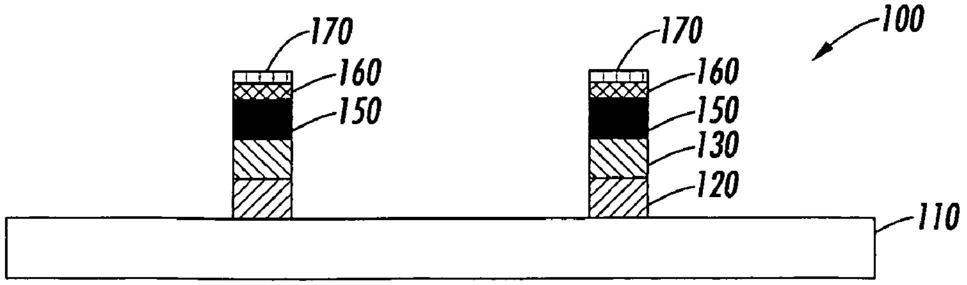

Once all manifold materials have been deposited, the surrounding photoresist 140 (and any additional photoresist layer) is removed as shown in FIG. 7. Although many conventional and subsequently developed removal methods could be used, a preferred process uses a combination of Acetone and ultrasonic agitation. Once the photoresist 140 is removed, the seed layer materials 120, 130 (Ti or Au) may also be removed using an etchant. A preferred etchant is a dilute HF for a Ti material and a commercially available gold wet etchant for Au. This completes processing of a first wafer component 100 and results in the structure shown in FIG. 8 in which the side walls formed by Ni layer 150 and layers 120, 130 have a total height of about 70 μm.

Figure 9:
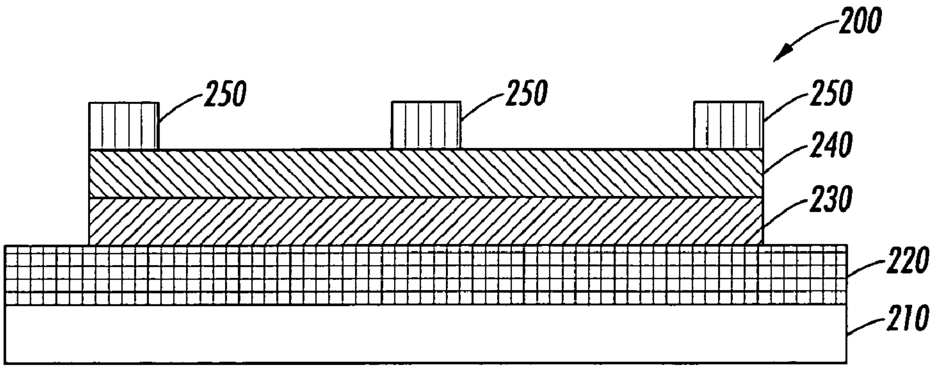
Figure 10:
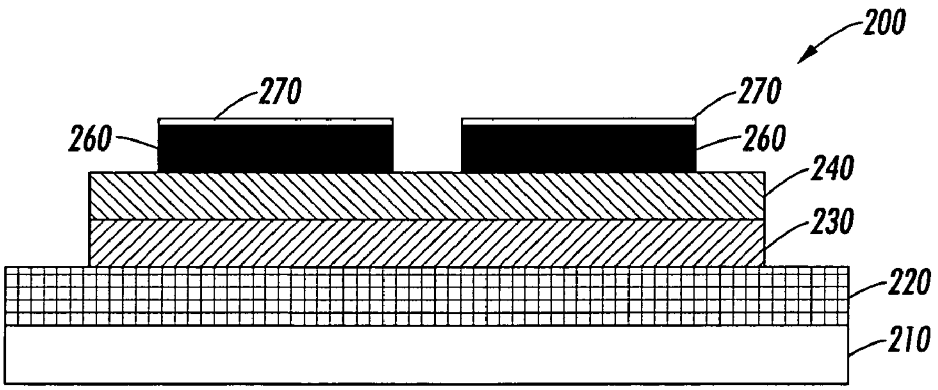

Once processing is completed on the first wafer 100, or concurrent therewith or even prior thereto, a similar process is conducted on second sacrificial wafer 200 of either silicon or glass. As shown in FIG. 9, a sacrificial material 210, such as a silicon Si or metal layer, is deposited so as to free the subsequently formed electroformed nozzle plate structures from the second wafer 200 after alignment and bonding is complete. Once seed materials 230, 240 have been deposited, a thick photoresist 250 is used to pattern nozzle plate structures with apertures formed through the thickness of the plates. As shown in FIG. 9, once patterned, electrodeposition of a suitable material, such as Ni, is again used to deposit a thick Ni film 260 forming the nozzle plate structures. The nozzle plates in a preferred embodiment have a thickness of between about 15–20 μm. However, other thicknesses are contemplated. Once complete, the photoresist is removed, preferably by using a combination of Acetone and ultrasonic agitation. This results in formation of the nozzle plate structure on the second semiconductor wafer 200.

Figure 11:
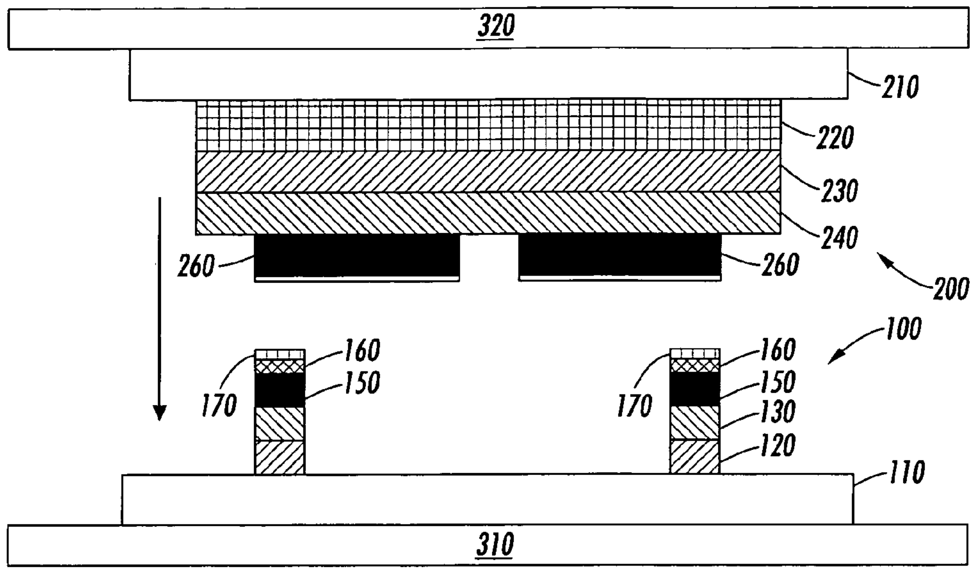
Figure 12:
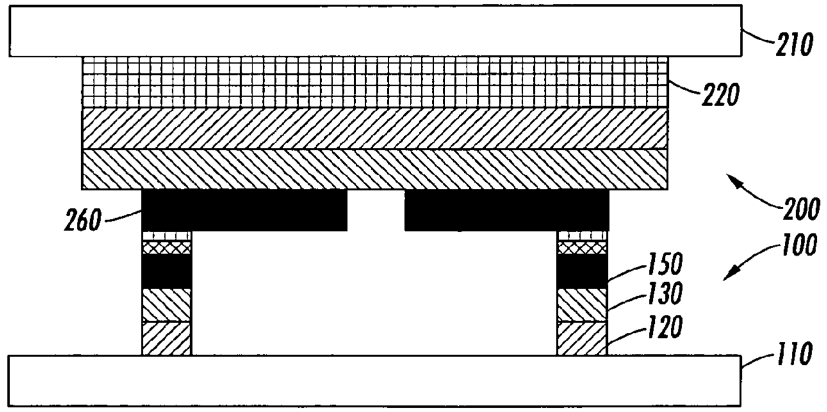

After completion of the processing of the first wafer 100 (containing manifold structures) and the second wafer 200 (containing nozzle structures), a “no-clean” flux is preferably applied to first wafer 100 containing the manifold structures in preparation for a PbSn solder reflow step and bonding to the nozzle plate structure containing wafer 200. Both wafers are then mounted on a flip-chip bonder for alignment and bonding. In particular, first wafer 100 is mounted on lower stage 310 and second wafer 320 is mounted on upper stage 320 (FIG. 11). Optionally, the flux step can be completed while in the chip flip alignment and bonding machine. Once properly aligned to one another, the wafers 100, 200 are brought into contact with one another as shown in FIG. 12 so that the electroformed nozzle plates formed by Ni layer 260 rest evenly and seal their counterpart manifold structures formed by Ni layer 150 residing on the MEMS/IC wafer 100.

Once alignment is complete, bonding layer 170 on the wafer pair is heated to a suitable reflow temperature. In the case where the bonding layer is a PbSn solder, a suitable temperature is in the range of 200–240° C., preferably about 220° C., for a period of about 60 seconds. During this heating, the PbSn layer 170 on the MEMS/IC wafer 100 becomes molten and “wicks” along the edges of the manifold structure (upper edge of manifold walls 150) to form a seal between both the upper edges of the manifold structure and the lower edges of the nozzle plate structures. During this process, both wafers 100, 200 become bonded to each other by way of the solder bond formed between the nozzle plate and manifold structures. Final reflow may be conducted on a separate hot plate of the flip-chip device 300.

The bonded wafer pair is then removed from the flip-chip bonder and further processed to remove or release the sacrificial layer 220 deposited earlier on the nozzle plate wafer base substrate 210. This can be done, for example, by using $XeF_2$ gas to etch all a-Si material 220 leaving all other structures in tact. However, a metallic sacrificial layer could be substituted for layer 220. Such a metal layer may offer greater processing compatibility with the processed Si wafers and reduce complexity in ensuring that both the polysilicon actuator elements and any exposed silicon electrical elements are not attacked during the wafer release process.

Figure 13:
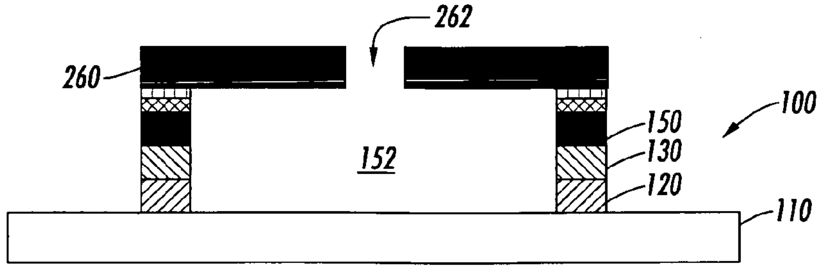

Once release of layer 220 is completed, the sacrificial wafer 200 can be removed, as shown in FIG. 13, leaving wafer 100 (MEMS/IC wafer) intact with the nozzle plate structures 260 transferred from wafer 200 and now soldered in place on top of the manifold structures 150 of wafer 100.

Details of an exemplary embodiment used to form an ink jet manifold and nozzle structure in a MEMS-type ink jet printhead can be further found with reference to FIGS. 14–33.

Figure 14:
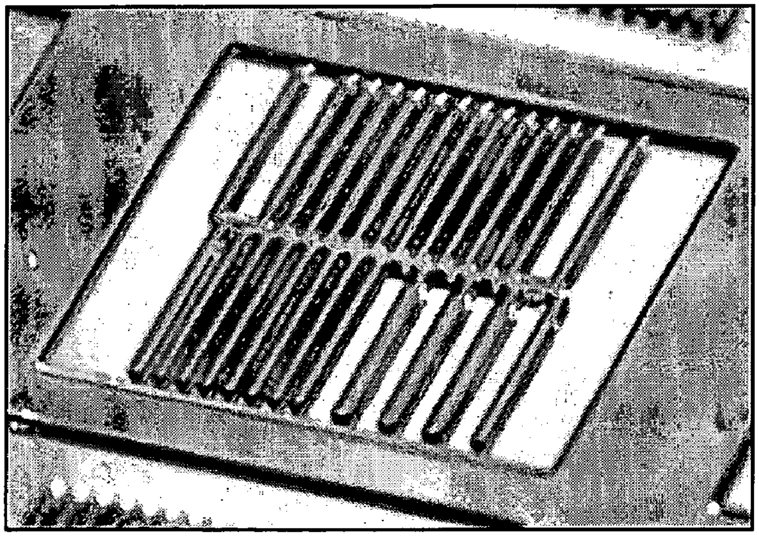
FIGS. 14–15 show magnified images of a nickel manifold and nozzle structure formed in accordance with aspects of the fabrication sequence of FIGS. 3–13.
Figure 15:
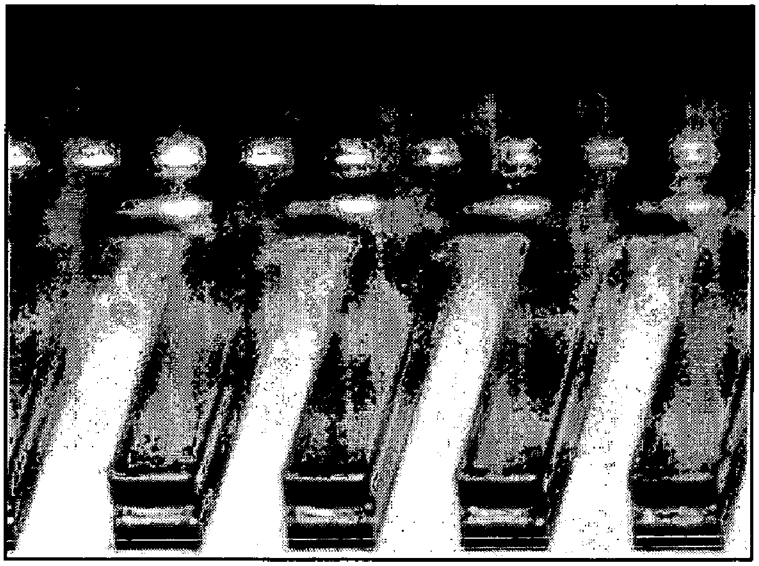

FIG. 14 shows a scanning electron microscope (SEM) view of photoresist 140 applied to the first wafer to define the manifold structure. In this example, a thickness of about 40 μm of BPR-100 photoresist is applied. Spray development is performed on a hotplate at about 40° C. FIG. 15 shows an SEM view of an exemplary photoresist layer 250 of BPR-100 applied to the second wafer 200 to define the ink nozzle plate structure. The structures shown in FIGS. 14–15 have a total height of about 70 μm.

Figure 16:
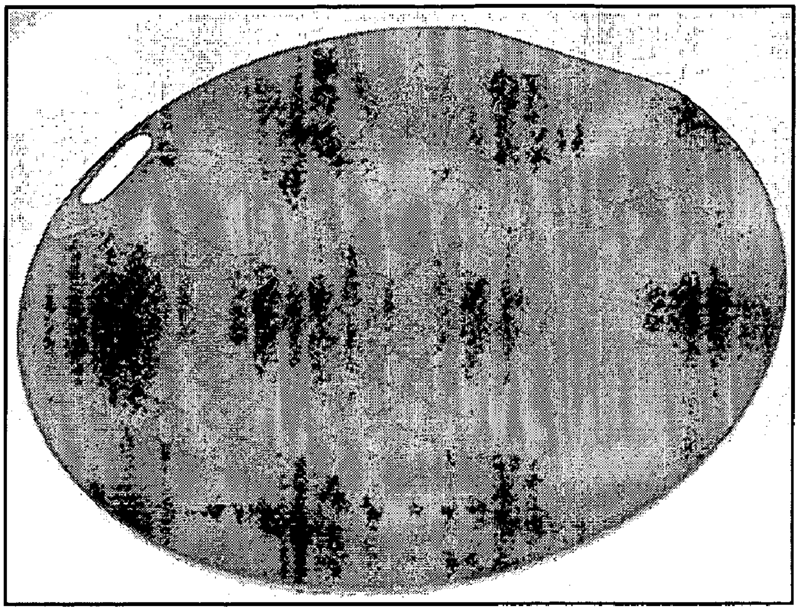
FIG. 16 shows an exemplary electrodeposition device for depositing nickel in the nozzle and manifold structure.
Figure 17:
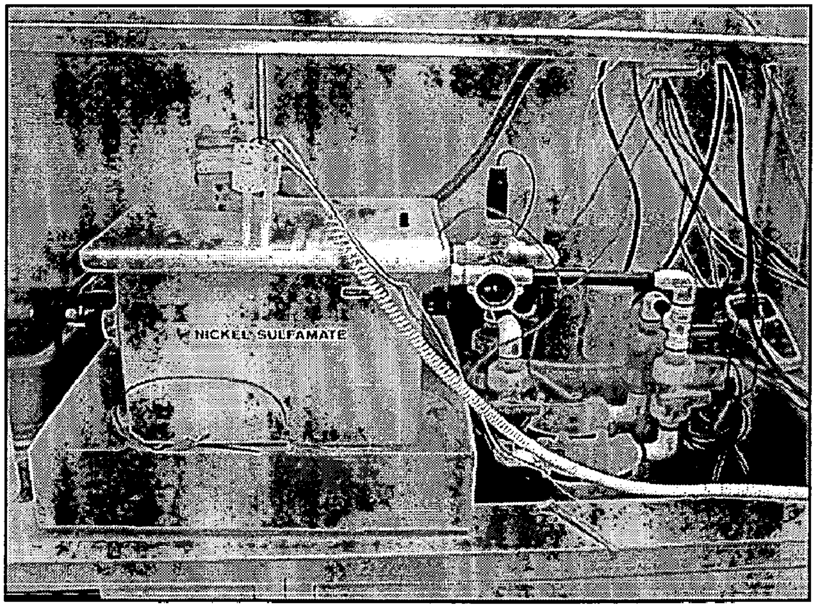
FIG. 17 shows the resultant electroplated wafer.
Figure 18:
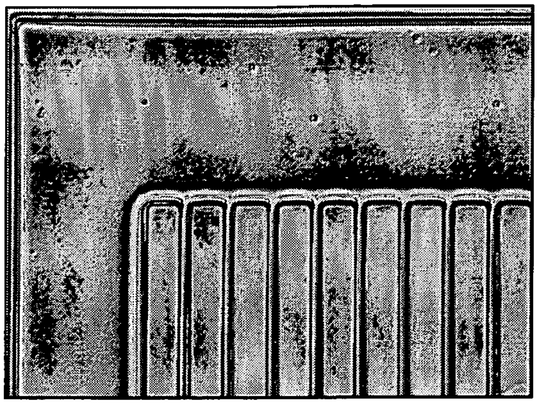
FIGS. 18–22 show various magnified images of resultant nickel plated manifold structures.
Figure 19:
Figure 20:
Figure 21:
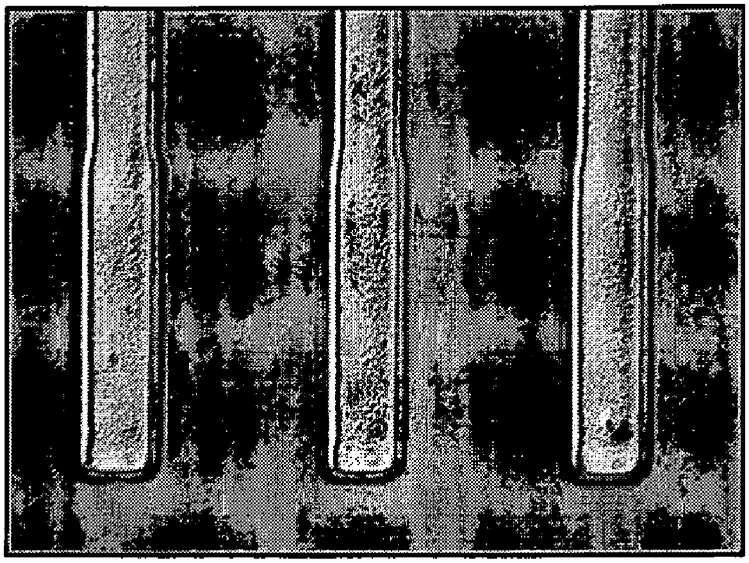
Figure 22:
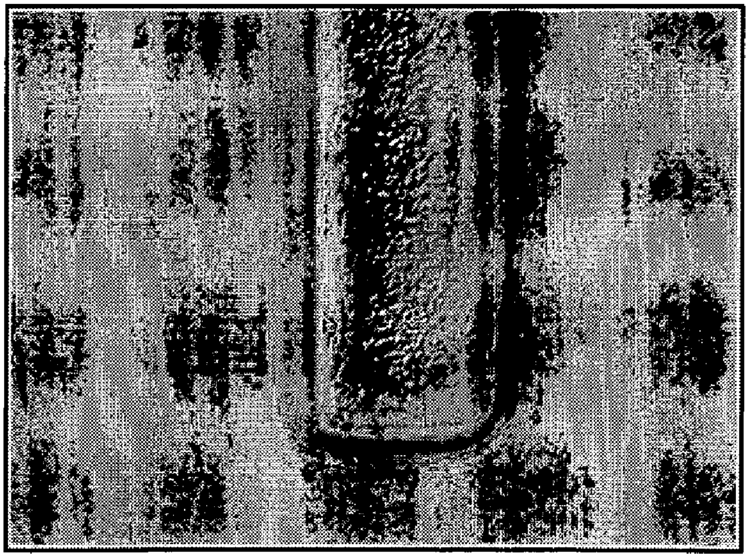

FIG. 16 shows sample formed wafers (either 100 or 200) after deposition of the photoresist. FIG. 17 shows an exemplary electroplating device used to form the Ni plating on wafers 100, 200. In particular, a nickel sulphamate bath run at about 45° C. was used to electrodeposit the Ni layer over the wafer substrates to form the manifold and nozzle plate structures 150, 260, respectively. When applied under a 500 mA forward pulse and a 1 mA reverse pulse, deposition rates of about 350 nm/min were developed. Obviously, this is just one possible electodeposition technique. Other techniques can be substituted to electrodeposit a desired thickness of manifold and nozzle material.

FIGS. 18–22 show additional SEM views of sample formed Ni plated manifold structures showing various surface details. These shots were taken using a differential interference filter to contrast surface height differences.

Figure 23:
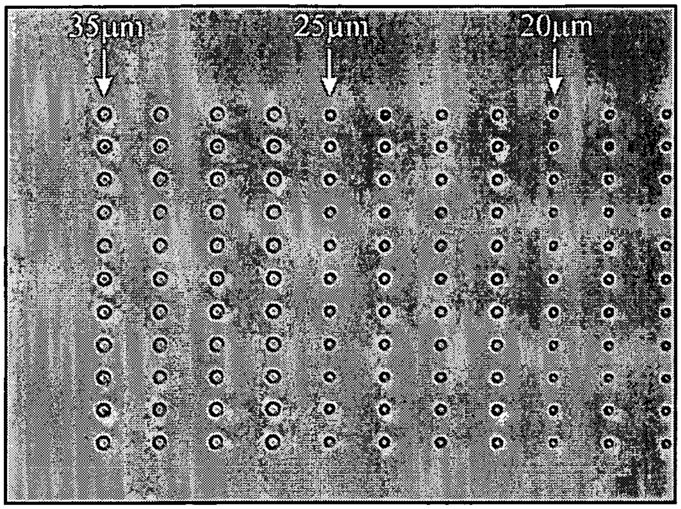
FIGS. 23–25 show various magnified images of the resultant nozzle structure.
Figure 24:
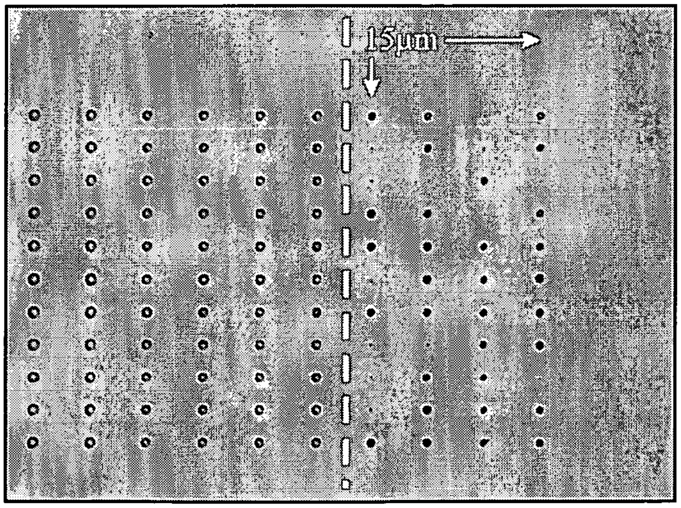
Figure 25:
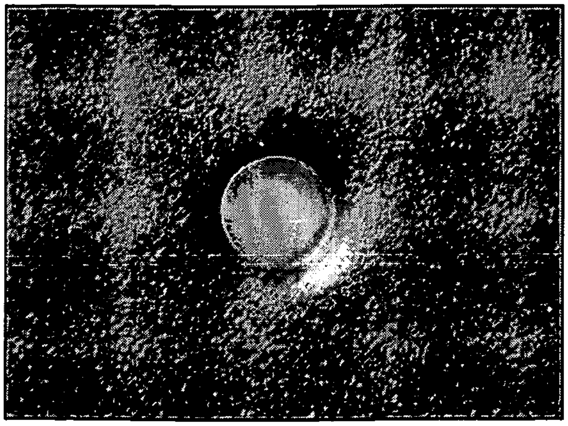

FIGS. 23–25 show details of the electroplated nozzle plate after application of the BPR-100 photoresist and electrodeposition of the Ni. In this sample, various nozzle diameters were experimented with. The thickness of the nozzle plates are around 15–20 μm. In these views, nozzle apertures still contain BPR-100 and are surrounded by electroplated Ni. After removal of the photoresist, the apertures will be opened. As evidenced from the views, the nozzle apertures readily exhibit a tapered edge on the underside of the nozzle plate. This corresponds to the inlet side of the nozzle plate. The outer edge of the aperture (ink outlet side) is typically flat. As also evidenced, nozzles were satisfactorily formed with diameters of at little as 20 μm, while smaller apertures exhibited higher failure rates. This establishes the viability of this fabrication process to accurately produce nozzle apertures of small diameter.

Figure 26:
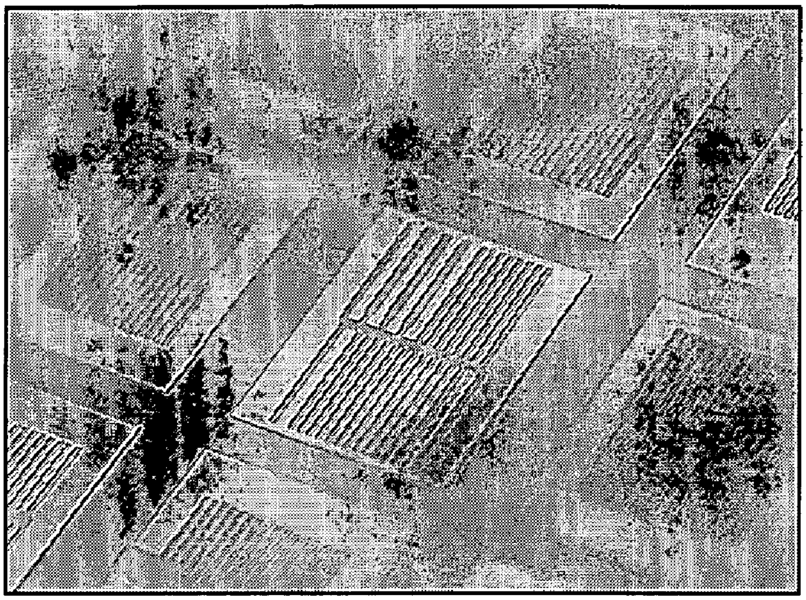
FIGS. 26–30 show various magnified images of the wafer after lead-tin (PbSn) electroplating.
Figure 27:
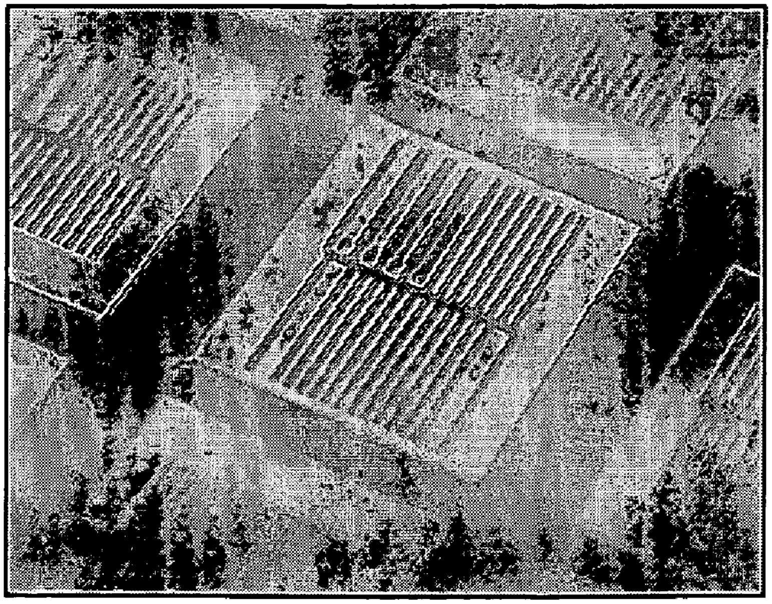
Figure 28:
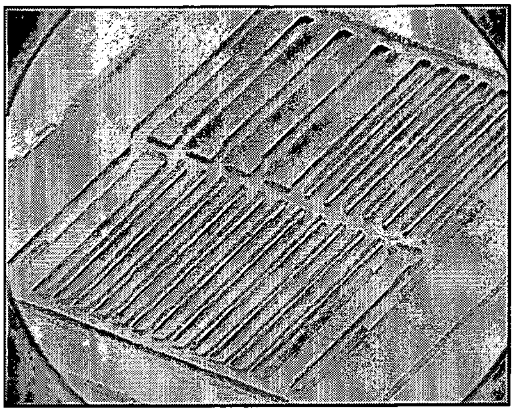
Figure 29:
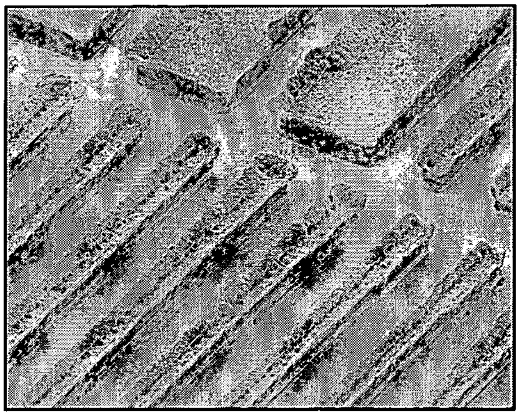
Figure 30:
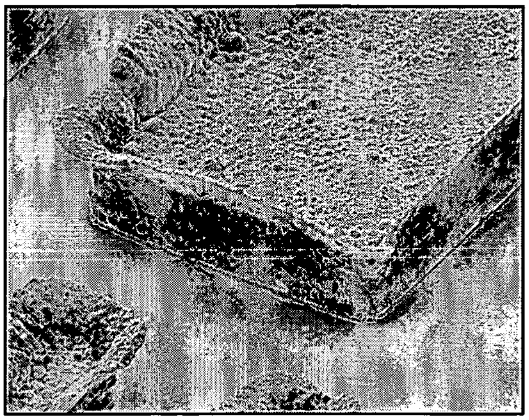

FIGS. 26–30 show SEM views of electroplating of the solder layer (PbSn). In these samples, a commercial acid-based solution of lead-tin (PbSn) solder was electrodeposited using a forward pulse of 250 mA and a reverse pulse of 1 mA to a thickness of about 1–3 μm. Deposition occurred at a rate of about 320 nm/min at a temperature of about 40° C. FIG. 26 shows Ni structures with electro-less Au deposited prior to PbSn electrodeposition. The BPR-100 photoresist remains in this view. FIG. 27 shows a SEM view of the Ni structures after both Au electro-less plating and PbSn electroplating. FIGS. 28–30 show more close up SEM views showing the plated PbSn structure. Care should be taken so that excess solder is not deposited. Otherwise too much solder may flow during the reflow process.

Figure 31:
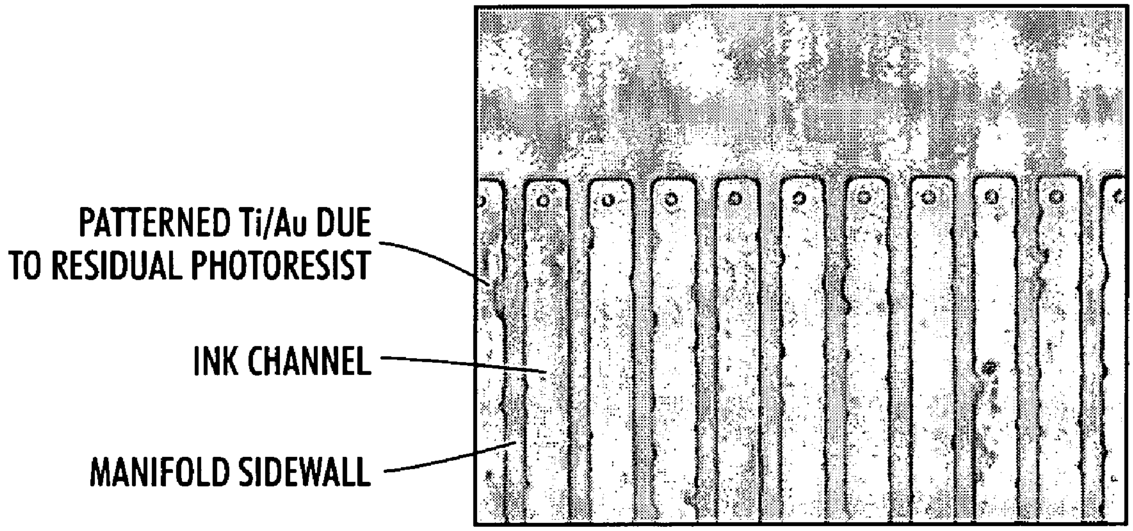
FIGS. 31–32 show magnified images of the wafer after alignment and just prior to solder reflow and final bonding.
Figure 32:
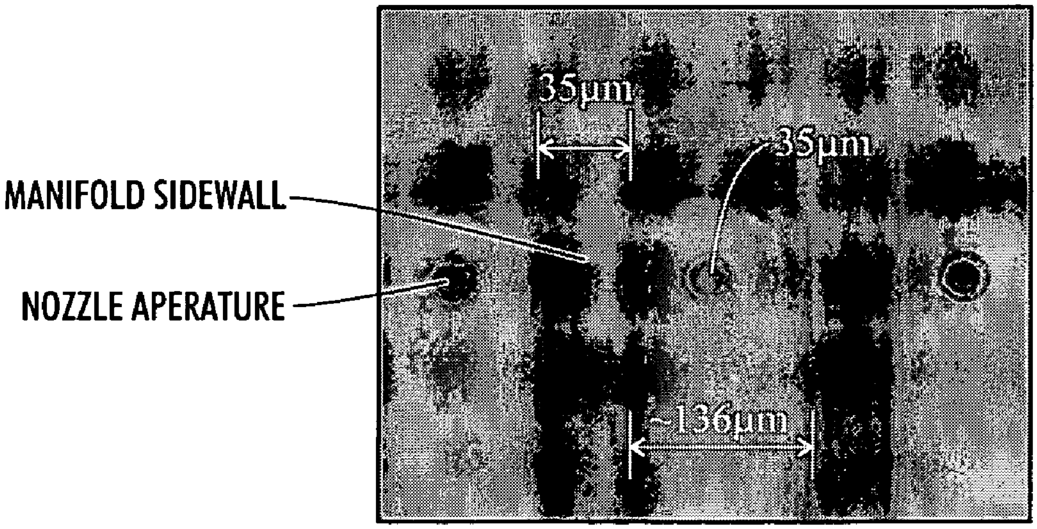
Figure 33:
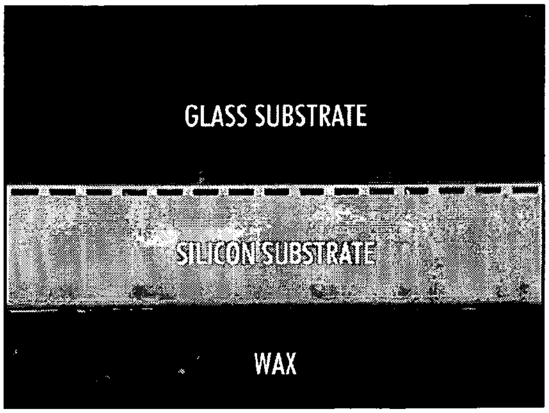
FIGS. 33–38 show various magnified cross-sectional views of the resultant ink manifold and nozzle structures.

FIGS. 31–32 show SEM views of the nozzle plate and manifold structures after alignment and just prior to final reflow of the solder layer. In this example, both the manifold and nozzle plate structures were fabricated on glass wafer substrates and viewed from the underside of the manifold substrate. In these views, you can see nozzle apertures 262, manifold sidewalls 154, and ink channels 152.

Figure 34:
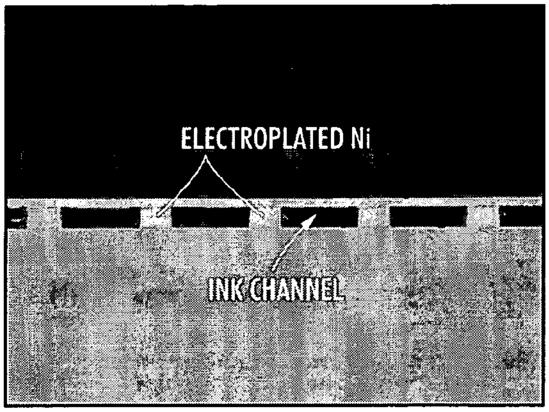
Figure 35:
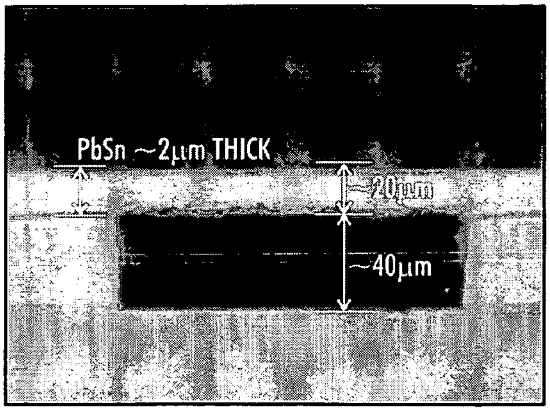
Figure 36:
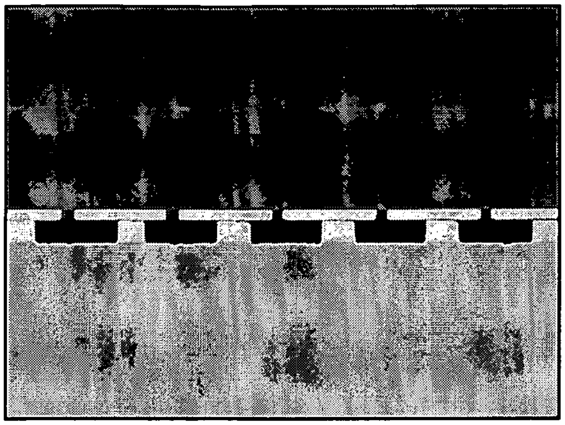
Figure 37:
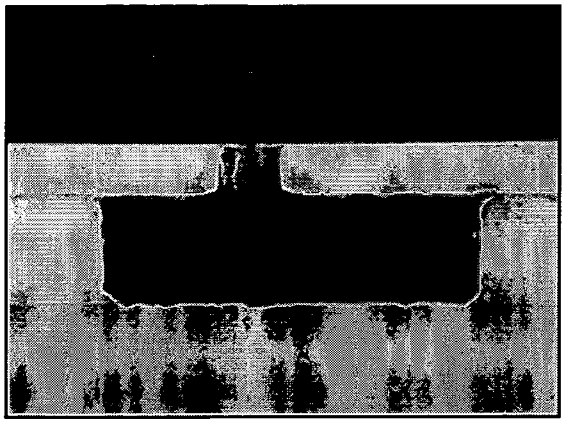
Figure 38:
Figure 39:
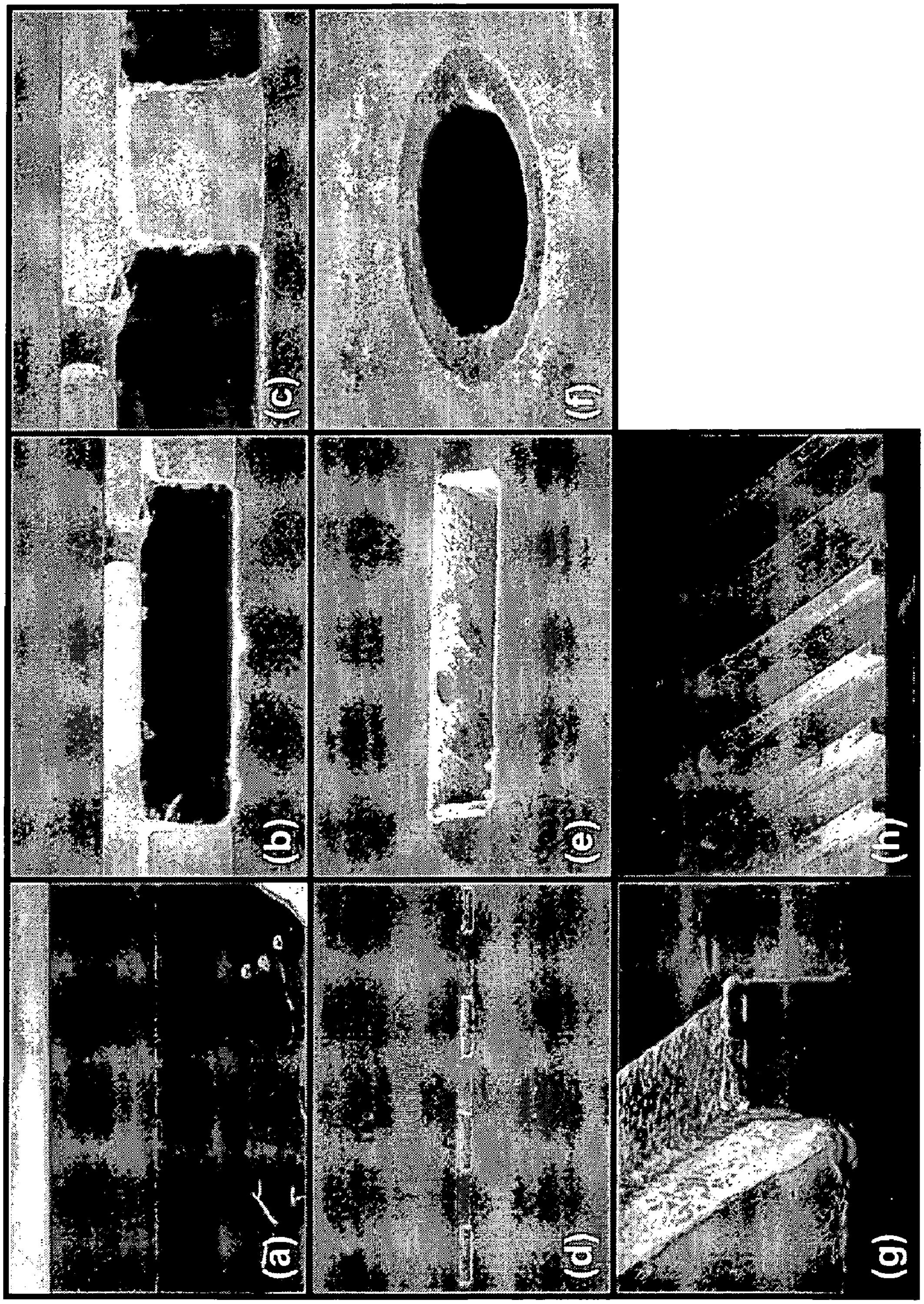
FIGS. 39A–H show various SEM shots that show the relative confinement of the solder after reflow.

FIGS. 33–38 show various SEM cross-sectional views of the aligned and bonded first and second wafers showing the reflow bond and final alignment of the resultant structures. In this example, the first wafer is a silicon wafer and the second wafer is a glass wafer. FIG. 34 shows how the electroplated Ni layers 150 and 260 form a three-dimensional structure that defines ink channels 152. FIG. 35 shows the channels having an average height of around 40 μm, the top nozzle plate has an average thickness of around 20 μm, and the PbSn layer has an average thickness of around 2 μm.

FIGS. 39A–H show various SEM shots that show the relative confinement of the solder after reflow. Although some wetting of solder and contaminants are found on the Ni sidewalls, such wetting was found to be negligible and did not result in blockage of apertures or channel structures.

Figure 40:
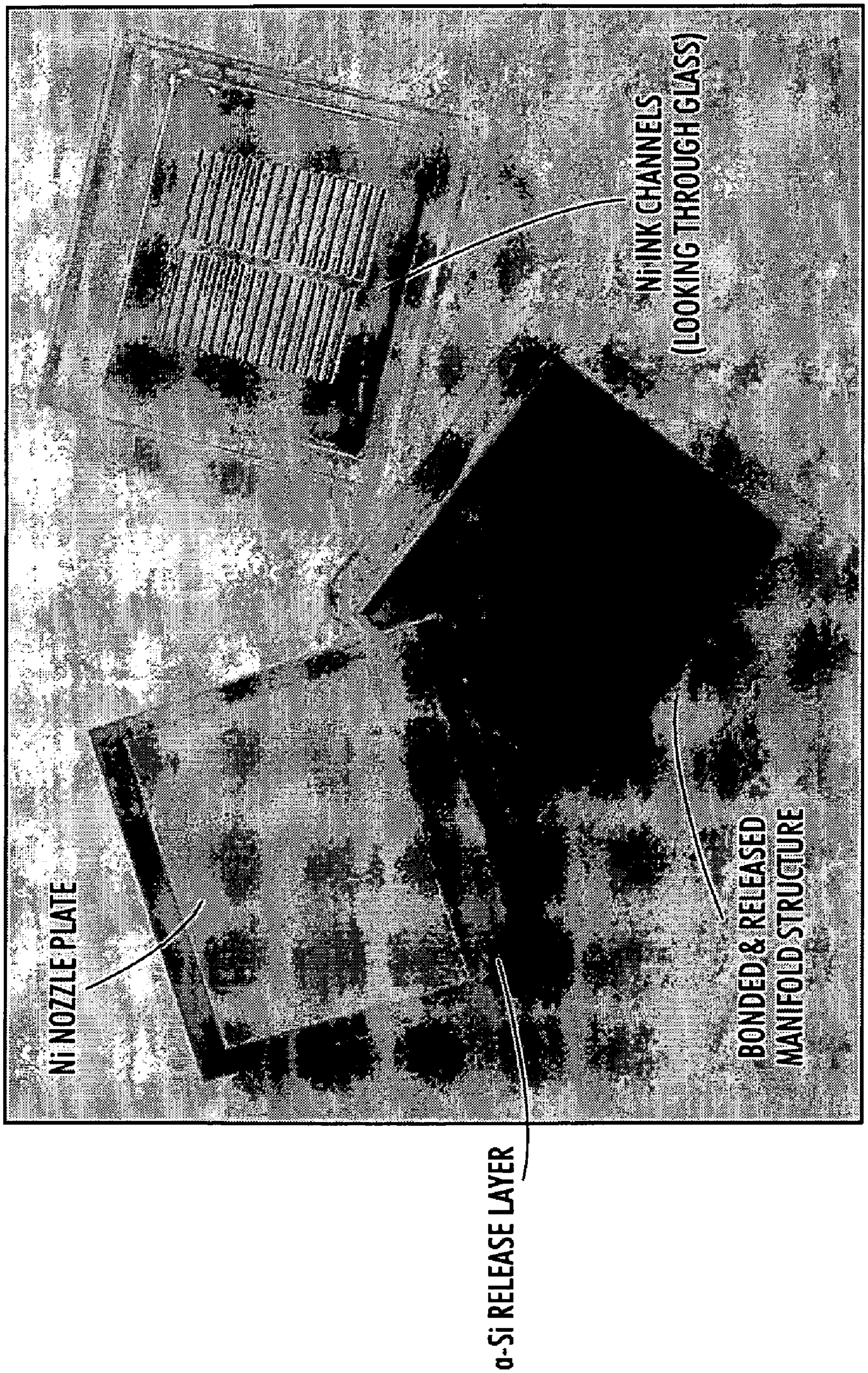
FIG. 40 shows a SEM view of nozzle plate, manifold structure and Ni ink channel structures.

FIG. 40 shows a SEM view of nozzle plate, manifold structure and Ni ink channel structures on working samples.

From the above, it has been established that wafer scale fabrication of three dimensional structures on a MEMS/IC containing device can be achieved using flip-chip alignment and bonding techniques along with a single layer electrodeposition on each of two wafers to form three dimensional structures.

Various alternatives can be provided. For example, the sacrificial layer on the nozzle wafer 200 does not have to be an a-Si material, but could be formed from other materials that are compatible with exposed devices on the silicon wafers 100, 200, such as Ti, Cr or other metal layers. Additionally, the bonding layer, or solder layer, does not have to be made from PbSn, but can encompass other commercially available or subsequently developed solder pastes or films. For example, a lead-free solder is often specified for many applications so a formulation such as Sn/Ag/Cu may be substituted. Suitability of the desired solder layer may be based on many considerations, including manufacturing considerations such as resolution limitations on current delivery mechanisms for such pastes using, for example, screen printing techniques.

Figure 41:
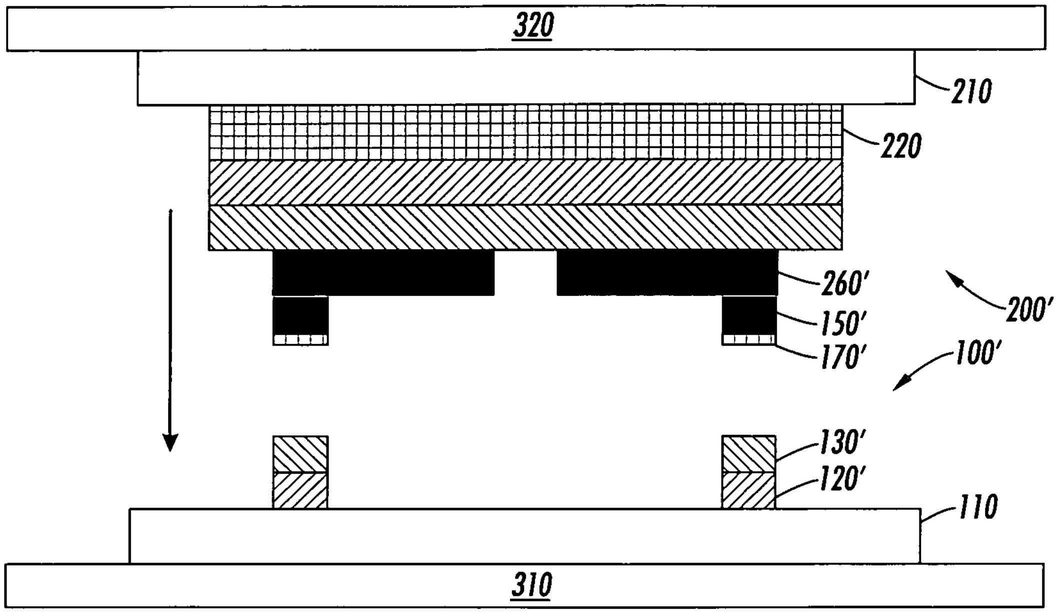
FIG. 41 shows an alternative embodiment in which the ink and manifold structural components are both provided on the same wafer substrate.

As shown in FIG. 41, other variations in the fabrication process can include the formation of the nozzle plate structure 260' on a second wafer 200' followed by patterning and fabrication of the manifold structure 150' on top of the nozzle plate structure to form a three dimensional structural element. Then, a solder material 170' can be deposited on the structures of the second wafer, such as on top of manifold structures 150'. This makes the nozzle plate/manifold joint an electroplated one and places the solder joint between the bottom of the manifold structure. A first wafer (MEMS/IC wafer) 100' includes patterned seed materials 120', 130' on which the three dimensional structure becomes bonded upon reflowing of solder material 170'.

Additionally, it is possible to perform various processing steps between the various depositions. For example, between the deposition of each layer pair, a chemical or mechanical polish/planarization step may be performed to smooth out wafer topography before another lithography step is performed. This process can be repeated until a desired structure and precision has been achieved.

Accordingly, the exemplary embodiments set forth above are intended to be illustrative, not limiting. Various changes may be made without departing from the spirit and scope of the disclosure. Therefore, the claimed systems and methods are intended to embrace all known, or later-developed, alternatives, modifications, variations, and/or improvements.

What is claimed is:

1. A wafer scale fabrication process for fabricating three dimensional structures having at least one substantially enclosed cavity on a processed wafer including die elements containing pre-existing MEMS and IC structures thereon, comprising:

applying and patterning a first photoresist mask on a first wafer containing at least one die having pre-existing MEMS and IC structures thereon to define boundaries of a first three dimensional structural element component;

electrodepositing a structural layer of material into the patterned photoresist mask to define walls of the first three dimensional structural element component;

electrodepositing a reflowable bonding layer on top of the structural layer;

removing the first photoresist mask;

applying and patterning a second photoresist mask on a second sacrificial wafer to define boundaries of a second three dimensional structural element component;

electrodepositing a structural layer of material into the patterned second photoresist mask to define a second three dimensional structural element component;

removing the second photoresist mask;

mounting the first and second wafers on stages of a flip-chip alignment and bonding machine;

rotating one of the stages to provide the first and second three dimensional structural element components in a spaced opposed orientation;

precisely aligning the first and second three dimensional structural element components relative to each other;

relatively moving the first and second wafers towards each other until the first and second three dimensional structural element components are substantially abutted;

applying heat to reflow the bonding layer and bond the first three dimensional structural element component to the second three dimensional structural element component; and removing the second sacrificial wafer from the second three dimensional structural element component to form an integrated three dimensional structural element on a MEMS/IC containing die.

2. The wafer scale fabrication process according to claim 1, wherein the die is an ink jet printhead containing a MEMS ink actuator.

3. The wafer scale fabrication process according to claim 2, wherein the three dimensional structural element forms ink manifold and nozzle structures that include at least one substantially enclosed ink cavity having side walls, top wall, and aperture.

4. The wafer scale fabrication process according to claim 3, wherein the first three dimensional structural element component forms the side walls and the second three dimensional structural element component forms the top wall and aperture.

5. The wafer scale fabrication process according to claim 1, wherein the structural layer is Ni.

6. The wafer scale fabrication process according to claim 5, further comprising applying electrolessly an Au layer on top of the Ni structural layer prior to deposition of the reflowable bonding layer.

7. The wafer scale fabrication process according to claim 6, wherein the reflowable bonding layer is solder.

8. The wafer scale fabrication process according to claim 5, wherein the reflowable bonding layer is a lead-based solder.

9. The wafer scale fabrication process according to claim 8, wherein the lead-free solder is PbSn.

10. The wafer scale fabrication process according to claim 5, wherein the reflowable bonding layer is a lead-free solder.

11. The wafer scale fabrication process according to claim 1, further comprising applying a release layer onto the second sacrificial wafer prior to electrodeposition of the structural layer.

12. The wafer scale fabrication process according to claim 11, wherein the release layer is an a-Si layer.

13. The wafer scale fabrication process according to claim 11, wherein the release layer is a metal layer.

14. The wafer scale fabrication process according to claim 11, wherein the metal layer include Ti or Cr.

15. A wafer scale fabrication process for fabricating three dimensional structures having at least one substantially enclosed cavity on a processed wafer including die elements containing pre-existing MEMS and IC structures thereon, comprising:

providing a first wafer containing at least one die having pre-existing MEMS and IC structures thereon;

applying a patterned seed material on the die on the first wafer;

applying and patterning a first photoresist mask on a second wafer to define boundaries of a first three dimensional structural element component;

electrodepositing a structural layer of material into the patterned photoresist mask to define walls of the first three dimensional structural element component;

applying and patterning a second photoresist mask on a second sacrificial wafer to define boundaries of a second three dimensional structural element component;

electrodepositing a second structural layer of material into the patterned second photoresist mask to define a second three dimensional structural element component;

removing the second photoresist mask;

electrodepositing a reflowable bonding layer on top of the second structural layer;

mounting the first and second wafers on stages of a flip-chip alignment and bonding machine;

rotating one of the stages to provide the first and second wafers in a spaced opposed orientation;

precisely aligning the first and second three dimensional structural element components to each other;

relatively moving the first and second wafers towards each other until the first and second three dimensional structural element components are substantially abutted to the first wafer;

applying heat to reflow the bonding layer and bond the second three dimensional structural element component to the seed material of the first wafer; and removing the second sacrificial wafer from the second three dimensional structural element component to form an integrated three dimensional structural element on a MEMS/IC containing die.

16. The wafer scale fabrication process according to claim 15, wherein the die is an ink jet printhead containing a MEMS ink actuator.

17. The wafer scale fabrication process according to claim 16, wherein the three dimensional structural element forms ink manifold and nozzle structures that include at least one substantially enclosed ink cavity having side walls, top wall, and aperture.

18. The wafer scale fabrication process according to claim 16, wherein the structural layer is Ni.

19. The wafer scale fabrication process according to claim 16, wherein the reflowable bonding layer is solder.

20. The wafer scale fabrication process according to claim 16, further comprising applying a release layer onto the second sacrificial wafer prior to electrodeposition of the structural layer.

* * * * *

UNITED STATES PATENT AND TRADEMARK OFFICE

CERTIFICATE OF CORRECTION

PATENT NO. : 7,169,649 B2
APPLICATION NO. : 11/012597
DATED : January 30, 2007
INVENTOR(S) : Michel A. Rosa and Eric Peeters It is certified that error appears in the above-identified patent and that said Letters Patent is hereby corrected as shown below:

On the Title Page,

Please delete the following:

(73) Assignee: Palo Alto Research Center, Inc., Palo Alto, CA (US)

and Replace with the following:

(73) Assignee: Palo Alto Research Center Incorporated, Palo Alto, CA (US)

Signed and Sealed this

Nineteenth Day of August, 2008

JON W. DUDAS
*Director of the United States Patent and Trademark Office*